United States Patent [19]
Oikawa

[11] Patent Number: 5,324,954
[45] Date of Patent: Jun. 28, 1994

[54] SYSTEMS FOR ADJUSTING AND EVALUATING POSITIONAL RELATIONSHIP BETWEEN LIGHT-RECEIVING ELEMENT AND OPTICAL FIBER

[75] Inventor: Yoichi Oikawa, Kawasaki, Japan
[73] Assignee: Fujitsu Limited, Kanagawa, Japan
[21] Appl. No.: 32,115
[22] Filed: Mar. 17, 1993

[30] Foreign Application Priority Data

Mar. 18, 1992 [JP] Japan .................................. 4-062568

[51] Int. Cl.⁵ .......................................... G01N 21/86
[52] U.S. Cl. ................................ 250/561; 250/227.24
[58] Field of Search ....................... 250/227.11, 227.24, 250/216, 561; 356/73.1; 385/15

[56] References Cited

U.S. PATENT DOCUMENTS 4,664,732 5/1987 Campbell et al. .................. 356/73.1

FOREIGN PATENT DOCUMENTS 57-112708 7/1982 Japan.

Primary Examiner—David C. Nelms
Attorney, Agent, or Firm—Armstrong, Westerman, Hattori, McLeland & Naughton

[57] ABSTRACT

Systems for adjusting and evaluating the positional relationship between a light-receiving element and an optical fiber optically coupled thereto. The light-receiving element comprising a lens and a light-receiving portion with an electrode surface is a back incidence type having the lens located on the side opposite to the electrode surface of the light-receiving portion. The adjusting system scans the optical fiber with respect to the light-receiving element in order to obtain the intensity distribution of reflected feedback light from the electrode surface in the fiber scanning direction. The system then finds a region where the measured intensity increases in the intensity distribution and obtains the positional relationship between optical fiber and light-receiving element based on that region. The relationship thus obtained provides the basis for allowing the system to displace at least one of the optical fiber and light-receiving element so as to attain a necessary positional relationship therebetween.

15 Claims, 19 Drawing Sheets

SCANNING DIRECTION →

SCANNING DIRECTION →

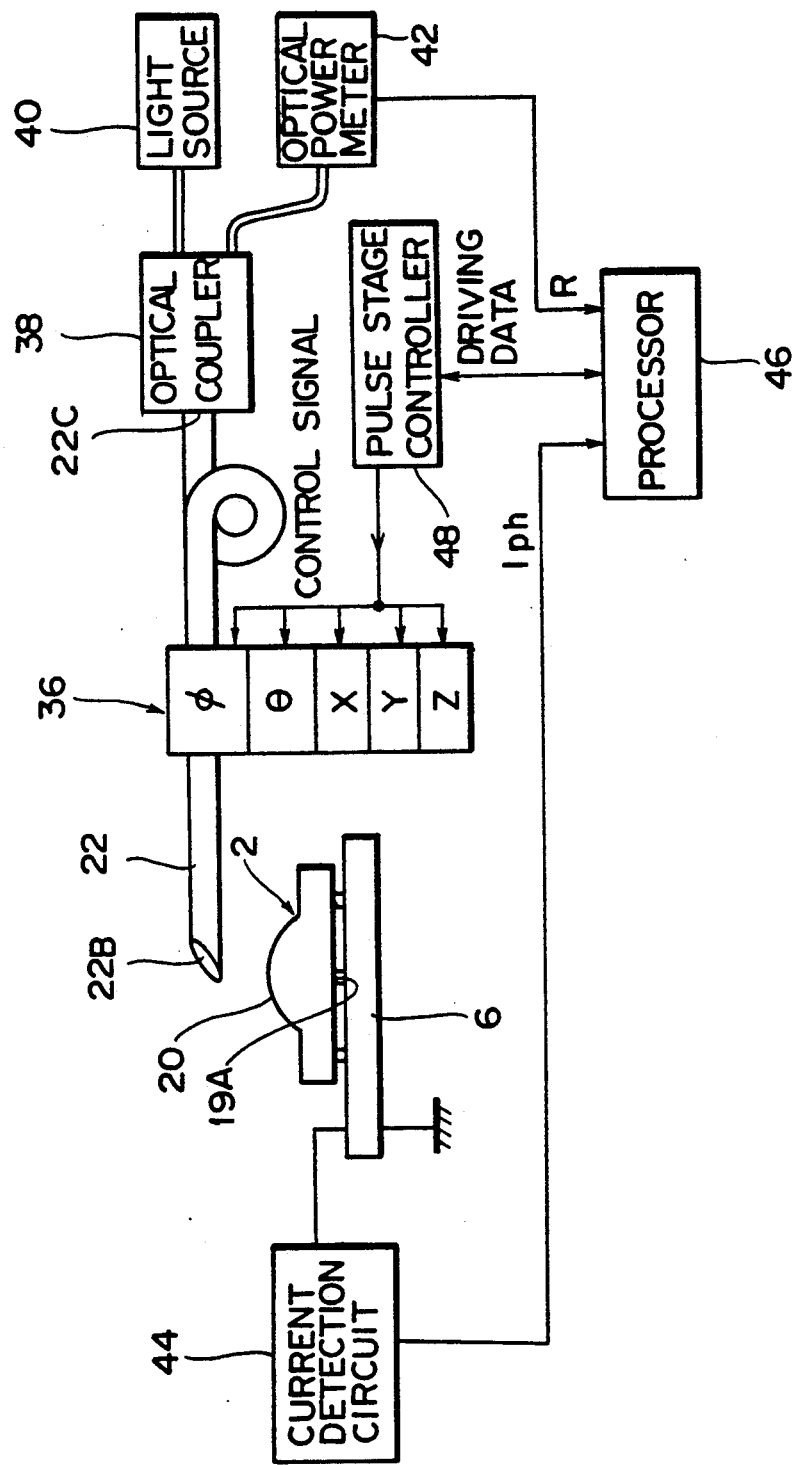

SYSTEMS FOR ADJUSTING AND EVALUATING POSITIONAL RELATIONSHIP BETWEEN LIGHT-RECEIVING ELEMENT AND OPTICAL FIBER

BACKGROUND OF THE INVENTION

1. Field of the Invention

The present invention relates to systems for adjusting and evaluating the positional relationship between a light-receiving element and an optical fiber optically coupled thereto.

The growing demand in recent years for long distance communications has entailed a trend towards higher transmission rates being required of communication systems. Of the communication systems, optical communication systems in particular are required to offer increasingly higher transmission rates on the order of multiple gigabits. Efforts are being made to develop optical communication equipment that would meet the high-speed requirement. In this respect, it is mandatory illustratively for optical receivers to have fast-acting light-receiving elements. Light-receiving elements of this kind are generally small in diameter so as to reduce the element capacitance. Furthermore, single-mode fibers used as high-speed optical transmission paths are also small in diameter. Where a light-receiving element and an optical fiber are to be connected under the constraints above, the positional relationship therebetween needs to be adjusted and evaluated with high precision by appropriate systems. The evaluation of the positional relationship is contingent illustratively on the time-induced deterioration of the efficiency of coupling between light-receiving element and optical fiber.

DESCRIPTION OF THE RELATED ART

The efficiency of the optical coupling between optical fiber and light-receiving element depends on the positional relationship therebetween. The parameters of that positional relationship comprise the position, in three-dimensional coordinates, of the optical fiber end from which light is emitted (i.e., three coordinates), and two angles regarding the optical fiber. Where the optical fiber has its end so treated as to emit light in the axial direction, the parameter angles are two tilt angles of the fiber axis relative to two reference planes that are perpendicular to each other; where the optical fiber has its end treated to emit light in the direction substantially perpendicular to the fiber axis, one of the parameter angles is the rotation angle of the optical fiber around the fiber axis, and the other is the tilt angle of the fiber axis relative to one reference plane. This means that as many as five parameters need to be adjusted in order to determine the positional relationship between optical fiber and light-receiving element in a way that maximizes the optical coupling efficiency therebetween. The work involved with the adjustment is very complicated and troublesome.

The typical prior art method for evaluating the positional relationship between optical fiber and light-receiving element involves measuring changes over time in the optical coupling efficiency therebetween; the changes stem from the misalignment occurring in that relationship. This method is not practical because of the need to dispose initially the optical fiber at the edge of a tolerance curve representing the allowable range of the optical coupling efficiency.

SUMMARY OF THE INVENTION

It is therefore an object of the present invention to provide simple and practical systems for adjusting and evaluating the positional relationship between light-receiving element and optical fiber.

In experiments conducted by the inventor, an optical fiber was scanned with respect to a back incidence type light-receiving element comprising a lens, an electrode surface and a light-receiving portion, the lens being located on the side opposite to the electrode surface on the light-receiving portion. The light emitted from the end of the optical fiber was reflected by the electrode surface of the light-receiving portion in the light-receiving element. The reflected light when entering again the optical fiber was measured for the intensity distribution in the fiber scanning direction. The measurement pointed to the presence of a region where the light intensity appreciably increases. Analyses by the inventor revealed that the region where the measured intensity thus increases (i.e., peak position) depends on the angle of the light that is incident on the electrode surface of the light-receiving portion. It follows that in principle, the presence of the region where the measured intensity increases allows the incident angle to be known relative to the electrode surface. The present invention is based on this principle in adjusting and evaluating the positional relationship between optical fiber and light-receiving element.

In carrying out the invention and according to one aspect thereof, there is provided an adjusting system for adjusting the positional relationship between an optical fiber and a back incidence type light-receiving element containing a lens and a light-receiving portion with an electrode surface, the optical fiber being optically coupled to the light-receiving element having the lens located on the side opposite to the electrode surface on the light-receiving portion, the adjusting system comprising: first means for scanning the optical fiber with respect to the light-receiving element so that the light emitted from an end of the optical fiber is reflected by the electrode surface, the reflected light entering again the optical fiber through the end, the first means further measuring the intensity distribution of the reflected light in the direction of the scanning; second means for obtaining the positional relationship between the light-receiving element and the optical fiber on the basis of a region where the measured intensity in the intensity distribution increases; and third means for establishing a required positional relationship between the light-receiving element and the optical fiber by displacing at least one of the light-receiving element and the optical fiber in accordance with the positional relationship obtained by the second means.

According to another aspect of the invention, there is provided an evaluating system for evaluating the positional relationship between an optical fiber and a back incidence type light-receiving element containing a lens and a light-receiving portion with an electrode surface, the optical fiber being optically coupled to the light-receiving element having the lens located on the side opposite to the electrode surface on the light-receiving portion, the evaluating system comprising: means for scanning the optical fiber with respect to the light-receiving element so that the light emitted from an end of the optical fiber is reflected by the electrode surface, the reflected light entering again the optical fiber through the end, the means further measuring the intensity distribution of the reflected light in the direction of the scanning; means for positioning the optical fiber close to the position where the measured intensity in the intensity distribution is maximized; and means for comparing the measured intensity of the reflected light entering again the optical fiber through the end, between two points in time: before a change over time in the positional relationship, and thereafter.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 17 is a block diagram of typical equipment for operating the adjusting and evaluating systems according to the invention;

DESCRIPTION OF THE PREFERRED EMBODIMENTS

Preferred embodiments of the invention will now be described with reference to the accompanying drawings.

Figure 1:
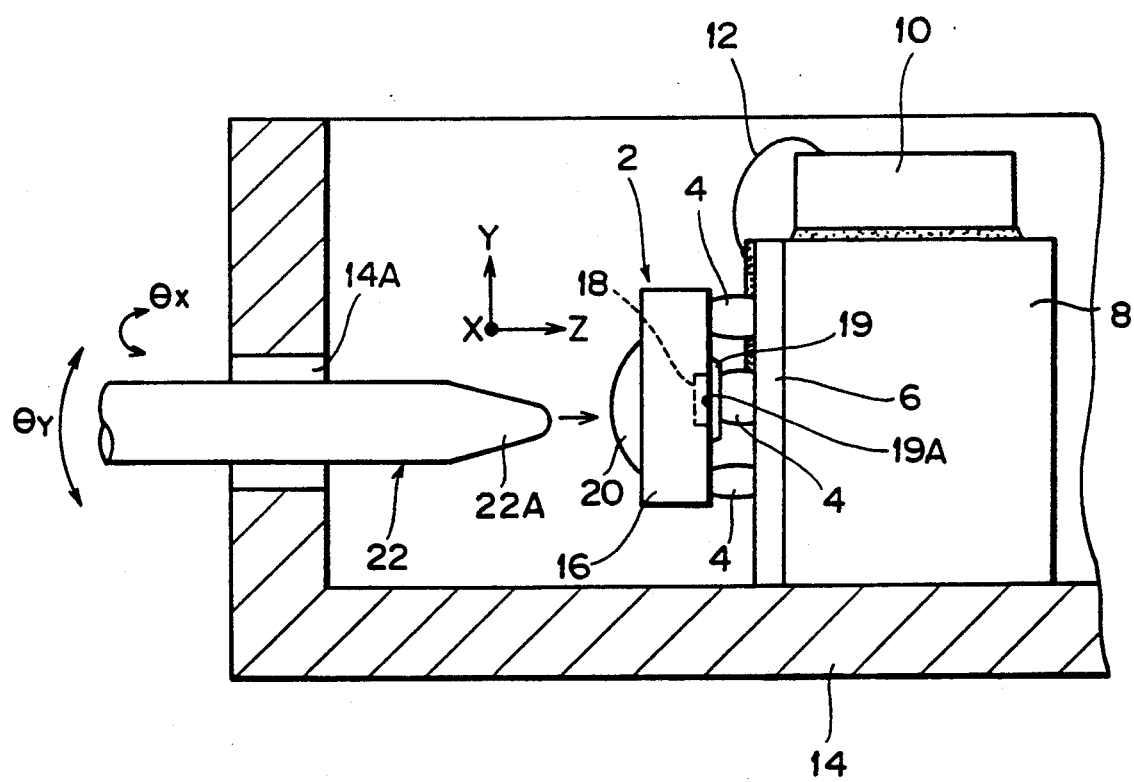
FIG. 1 is a cross sectional and broken view showing major parts of a optical receiver to which the invention may be applied.

FIG. 1 is a cross sectional and broken view showing major parts of a optical receiver to which the invention may be applied. In FIG. 1, a back incidence type light-receiving element 2 is fixed to a substrate 6 by flip-chip bonding using bumps 4 made illustratively of solder. The substrate 6 is attached fixedly to the front of a radiating block 8. Electronic circuit parts 10 such as a preamplifier IC are mounted fixedly on the top of the block 8. The substrate 6 is connected to the electronic circuit parts 10 using bonding wires 12. The block 8 is installed fixedly inside a package 14. The light-receiving element 2 comprises a semiconductor substrate 16 made illustratively of InP, a light-receiving portion (light-absorbing layer in this case) 18 formed within the semiconductor substrate 16 and made illustratively of InGaAs, an electrode 19 in contact with the light-receiving portion 18, and a lens 20 formed integrally on the semiconductor substrate 16 and projecting on the side opposite to an electrode surface 19A of the substrate 16. An optical fiber 22, to be optically coupled to the light-receiving element 2, is introduced into the package 14 through a hole 14A at the front of the package. An exciting end 22A of the optical fiber 22 is so treated as to emit light in the axial direction of the fiber. Specifically, the optical fiber 22 may be a tapered hemispherical end fiber (THF), i.e., the end of the fiber being treated in a tapered and hemispherically ending manner. Alternatively, the optical fiber may have its end so treated as to be perpendicular to the fiber axis direction.

In the description that follows, the THF will be handled in an orthogonal three-dimensional coordinate system having an X-Y plane in parallel with the electrode surface 19A of the light-receiving element. In other words, the orthogonal three-dimensional coordinate system has a Z axis perpendicular to the electrode surface 19A of the light-receiving element. For the THF setup, the five parameters defining the positional relationship between optical fiber and light-receiving element are: X, Y and Z coordinates of the tip of the optical fiber end 22A, tilt angle $\theta_x$ of the optical fiber 22 relative to the Y-Z plane, and tilt angle $\theta_y$ of the optical fiber 22 relative to the X-Z plane.

Figure 2:
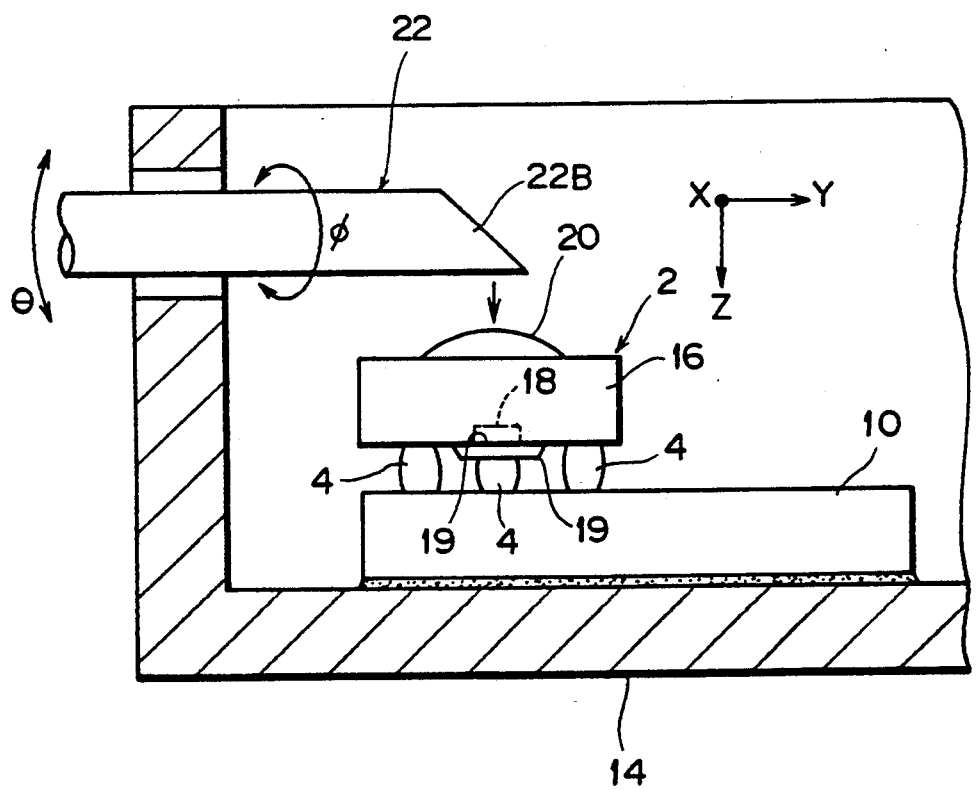
FIG. 2 is a cross sectional and broken view depicting major parts of another optical receiver to which the invention may be applied.

FIG. 2 is a cross sectional and broken view depicting major parts of another optical receiver to which the invention may be applied. In this example, the axial direction of the fiber is substantially in parallel with the electrode surface 19A of the light-receiving element. The end 22B of the optical fiber 22 is so treated as to emit light in the direction substantially perpendicular to the axial direction of the fiber. The light-receiving element 2 is fixed direct onto circuit parts 10 which in turn are secured inside the package 14. The light passing through the optical fiber 22 is reflected by a tilted surface of the end 22B. The reflected light is focused by the lens 20 before entering the light-receiving portion 18. In this setup, the light-receiving element 2 is connected direct to conductor patterns of the circuit parts 10 by flip-chip bonding. The connection improves the high-speed characteristic of the optical receiver by reducing the parasitic reactance involved. In the following description dealing with the slant end fiber (SEF) setup above, the optical fiber will be handled in an orthogonal three-dimensional coordinate system with its Z axis perpendicular to the electrode surface 19A of the light-receiving element and its Y-Z plane in parallel with the fiber axis. For the SEF setup, the five parameters defining the positional relationship between optical fiber and light-receiving element are: X, Y and Z coordinates of the tip of the optical fiber end 22B, rotation angle $\phi$ of the optical fiber 22 relative to the fiber axis, and tilt angle $\theta$ of the fiber axis relative to the X-Y plane.

In the constitution of the optical receiver of FIG. 1 or 2, the light-receiving element 2 equipped integrally with the lens 20 permits greater tolerance for any misalignment in the positional relationship between optical fiber and light-receiving element where a required efficiency of optical coupling therebetween is to be achieved. Further, the constitution of the optical receiver allows to reduce the diameter of the light-receiving portion 18, thereby lowering the capacitance of the light-receiving element and enhancing the high-speed characteristic of the optical receiver.

Figure 3A:
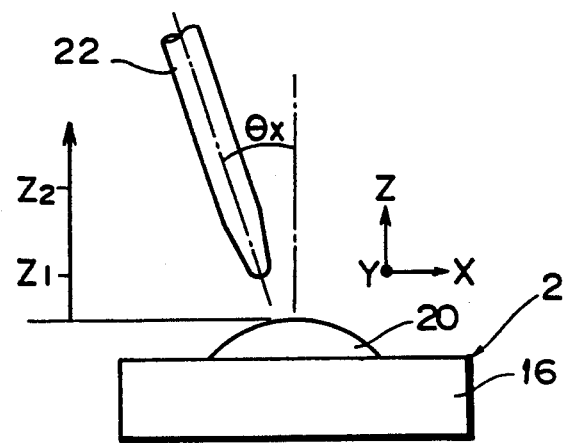
FIGS. 3A, 3B and 3C are views illustrating how the tilt angle $\theta_x$ of an optical fiber is obtained conventionally.
Figure 3B:
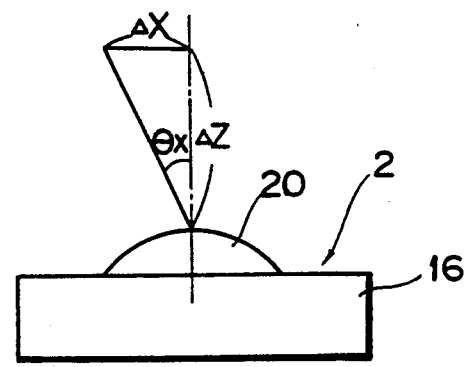
Figure 3C:
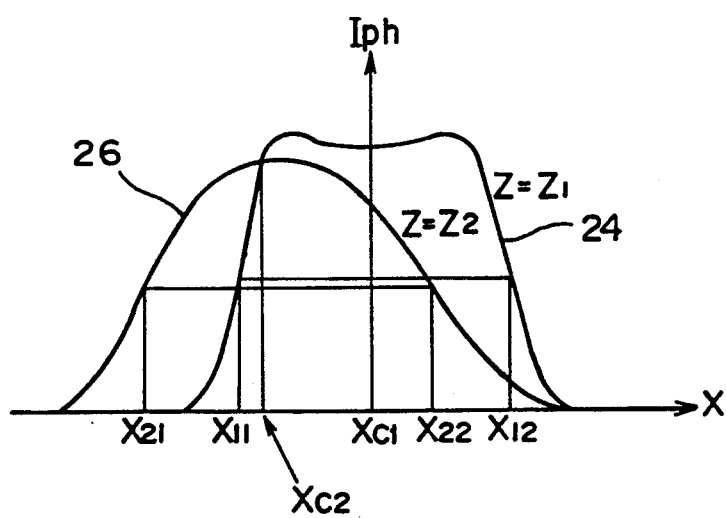

In the optical receiver of FIG. 1 or 2, its part near the end of the optical fiber is located inside the package. This makes it difficult readily to know the tilt angle and other parameters of the optical fiber. Conventionally, the tilt angle $\theta_x$ of the optical fiber in the THF setup of FIG. 1 is obtained as follows:

FIGS. 3A, 3B and 3C are views illustrating how the tilt angle $\theta_x$ of the optical fiber is obtained conventionally. Initially, a given Z coordinate is established ($Z=Z_1$). The optical fiber 22 is then scanned in the X axis direction while the photo-electric current Iph of the light-receiving element is being measured. This provides a tolerance curve (expressing the relation between photo-electric current and X axis coordinate) 24 in effect when $Z=Z_1$, as shown in FIG. 3C. On the tolerance curve 24, X coordinates $X_{11}$ and $X_{12}$ are obtained which provide a photo-electric current corresponding to half of the maximum photo-electric current. The mean value of the X coordinates $X_{11}$ and $X_{12}$ is obtained as $X_{C1}$. Then a Z coordinate $Z_2$ different from $Z_1$ is established ($Z_1 < Z_2$), and a tolerance curve 26 in effect when $Z=Z_2$ is acquired likewise. From the tolerance curve 26, X coordinates $X_{21}$ and $X_{22}$ are obtained which provide a photo-electric current corresponding to half of the maximum photo-electric current. The mean value of the X coordinates $X_{21}$ and $X_{22}$ is obtained as $X_{C2}$. Based on the assumptions above, the tilt angle $\theta_x$ of the optical fiber 22 is given by the expression:

$$\theta = \tan^1 [(X_{C2} - X_{C1})/(Z_2 - Z_1)] \qquad (1)$$

In the case above, as many as six measurements, $X_{11}$, $X_{12}$, $X_{21}$, $X_{22}$, $Z_1$ and $Z_2$, are needed to acquire the tilt angle $\theta_x$. The measuring procedures are complicated and troublesome. Where the tilt angle is small, the error of the tilt angle to be obtained is pronounced in inverse proportion. The error is reduced by taking a greater value of $\Delta Z (= Z_2 - Z_1)$. But there is a limit to reducing the error because raising the value of $\Delta Z$ lowers the maximum value of the tolerance curve. That is, the tilt angle of the optical fiber is subject to a detection limit. According to the invention, the characteristics of the back incidence type light-receiving element (having the lens located on the side opposite to the electrode surface of the light-receiving portion) are utilized in measuring the tilt angle and other parameters of the optical fiber connected optically to the light-receiving element.

Figure 4A:
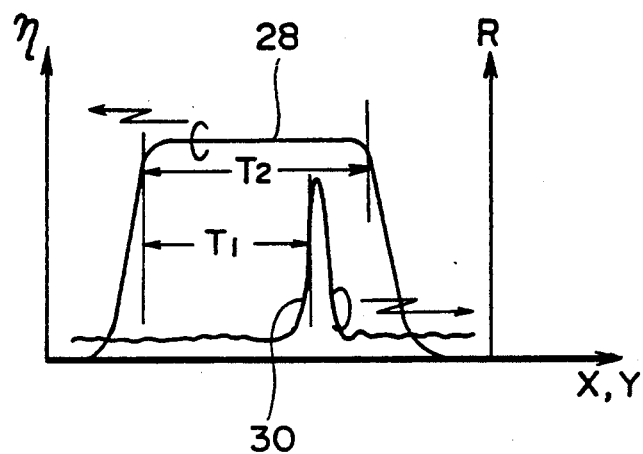
FIGS. 4A and 4B are views depicting reflected feedback light coming from an electrode surface of a back incidence type light-receiving element according to the invention.
Figure 4B:
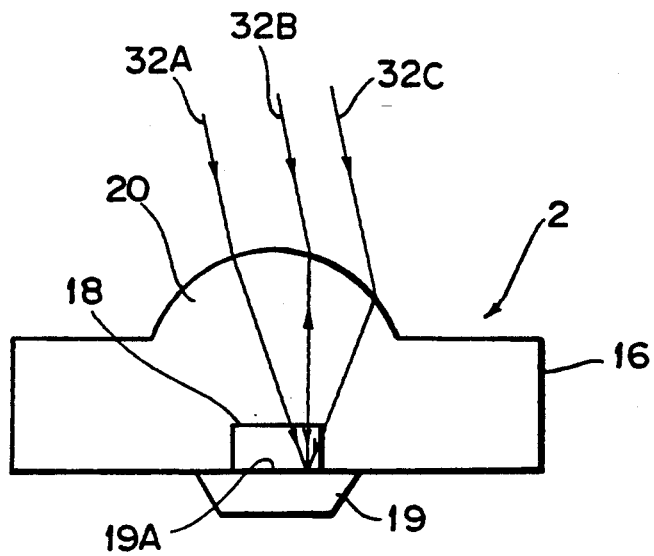

The graphic representation of FIG. 4A includes a tolerance curve 28 in effect when the optical fiber is scanned in the X-axis or Y-axis direction. A parameter $\eta$ on the axis of ordinate represents the efficiency of optical coupling. Specifically, where the radius of curvature of the lens in the light-receiving element is 55 $\mu$m and the aperture diameter of the same lens is 50 $\mu$m, the region providing 90% of the maximum optical coupling efficiency ($T_2$ in FIG. 4A) is 40 $\mu$m. Reference numeral 30 indicates the intensity distribution, in the fiber scanning direction, of the light that is emitted from the optical fiber end, reflected by the electrode surface of the light-receiving element, and input again into the optical fiber (called the reflected feedback light). In this case, a parameter R on the axis of ordinate denotes the intensity (i.e., reflectance) of the reflected feedback light. The reflected feedback light occurs as follows. Of light beams 32A, 32B and 32C entering and refracted by the lens 20, the light beam 32B reaches perpendicularly to the electrode surface 19A at an incident angle of 0°, as indicated in FIG. 4B. The light beam 32B, after being reflected by the electrode surface 19A, is emitted through the same light path as the incident light path. The invention takes advantage of the fact that the position of the peak in the intensity distribution of the reflected feedback light depends on the tilt angle of the axis of the light incident on the light-receiving element. The dependency is utilized in measuring the tilt angle and rotation angle of the optical fiber. The region $T_2$ (in FIG. 4A) is greater than the region $T_1$ where 90% of the maximum optical coupling efficiency is obtained and where the intensity of the reflected feedback light is less than what is required. In this case, there is no problem in practical terms as long as the region $T_1$ remains greater than the intrinsic accuracy of the optical fiber. According to the invention, the positional relationship between optical fiber and light-receiving element may be ! adjusted and evaluated on the basis of the intensity distribution of the reflected feedback light discussed above. An effective adjustment of the positional relationship depends on how to adjust the angle of the optical fiber as well as the distance between optical fiber and light-receiving element. How the adjustment and the evaluation are carried out will now be described separately.

(A) ADJUSTING THE POSITIONAL RELATIONSHIP BETWEEN OPTICAL FIBER AND LIGHT-RECEIVING ELEMENT (A-1) Optical fiber angle adjusting system The adjusting process in this system comprises three steps: a first step for obtaining the intensity distribution of the reflected feedback light in the fiber scanning direction; a second step for grasping the positional relationship between optical fiber and light-receiving element with reference to the region where the measured intensity increases in the intensity distribution; and a third step for establishing a required positional relationship between optical fiber and light-receiving element on the basis of the grasped positional relationship therebetween. In the first step, the intensity distribution of the reflected feedback light is obtained by scanning the optical fiber 22 in a predetermined direction within a plane paralleling the electrode surface 19A of the light-receiving element. In the second step, the positional relationship between optical fiber and light-receiving element is grasped by use of a first angle formed between a plane perpendicular to the scanning direction of the optical fiber on the one hand, and the emitted light axis of the optical fiber on the other. It should be noted that the emitted light axis is in parallel with the fiber axis in the THF setup and is perpendicular to the fiber axis in the SEF setup. In the third step, the tilt angle or rotation angle of the optical fiber is adjusted so that the first angle will take on a required value.

(A-1-1) Where the optical fiber end is so treated as to emit light in the axial direction of the fiber (THF, for example)

Figure 5A:
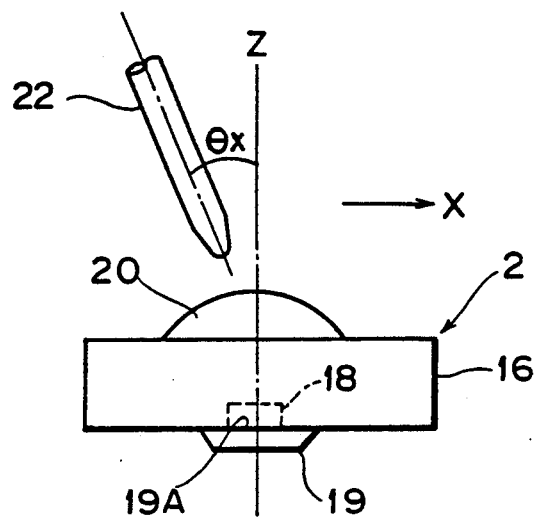
FIG. 5A and 5B are views describing how the tilt angle $\theta_x$ of the optical fiber is obtained according to the invention.
Figure 5B:
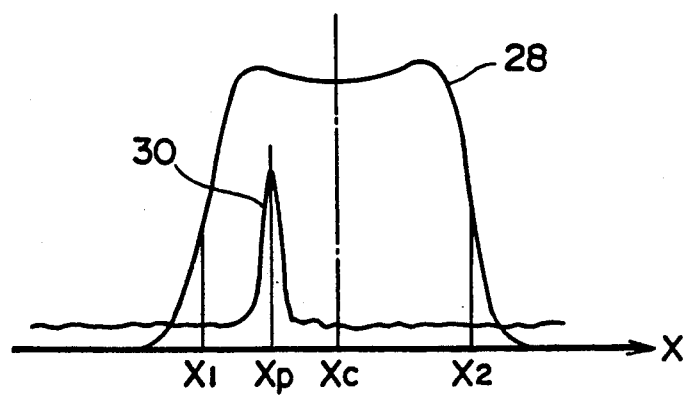

In this case, the direction in which to scan the optical fiber may be set anywhere within the X-Y plane. In particular, as shown in FIG. 5A, the X axis may be established on a plane comprising the geometric center axis of the optical fiber 22 and a projection of the latter axis onto the electrode surface 19A (the plane thus parallels the sheet showing the figure). When the optical fiber 22 is scanned in the direction of that X axis, a single adjustment suffices for determining the tilt angle $\theta_x$ of the optical fiber. Where the optical fiber 22 is scanned from negative to positive side along the X axis, the tilt angle $\theta_x$ of the fiber 22 (formed between the geometric center axis of the fiber 22 and a perpendicular to the electrode surface 19A) is calculated by use of the expression (2):

$$\theta_x = \frac{(X_p - X_c)(n_s - 1)}{(R_s^2 - (X_p - X_c)^2)^{\frac{1}{2}}} \quad (2)$$

where, $X_c$ (in FIG. 5B) is the coordinate representing the middle point of a region ($X_1$ through $X_2$) where the optical coupling efficiency is greater than a predetermined value (preferably half of the maximum optical coupling efficiency); $X_p$ is the coordinate of the point affording the maximum intensity in the intensity distribution of the reflected feedback light; $n_s$ is the refractive index of the lens 20; and $R_s$ is the radius of curvature of the lens 20.

Figure 6:
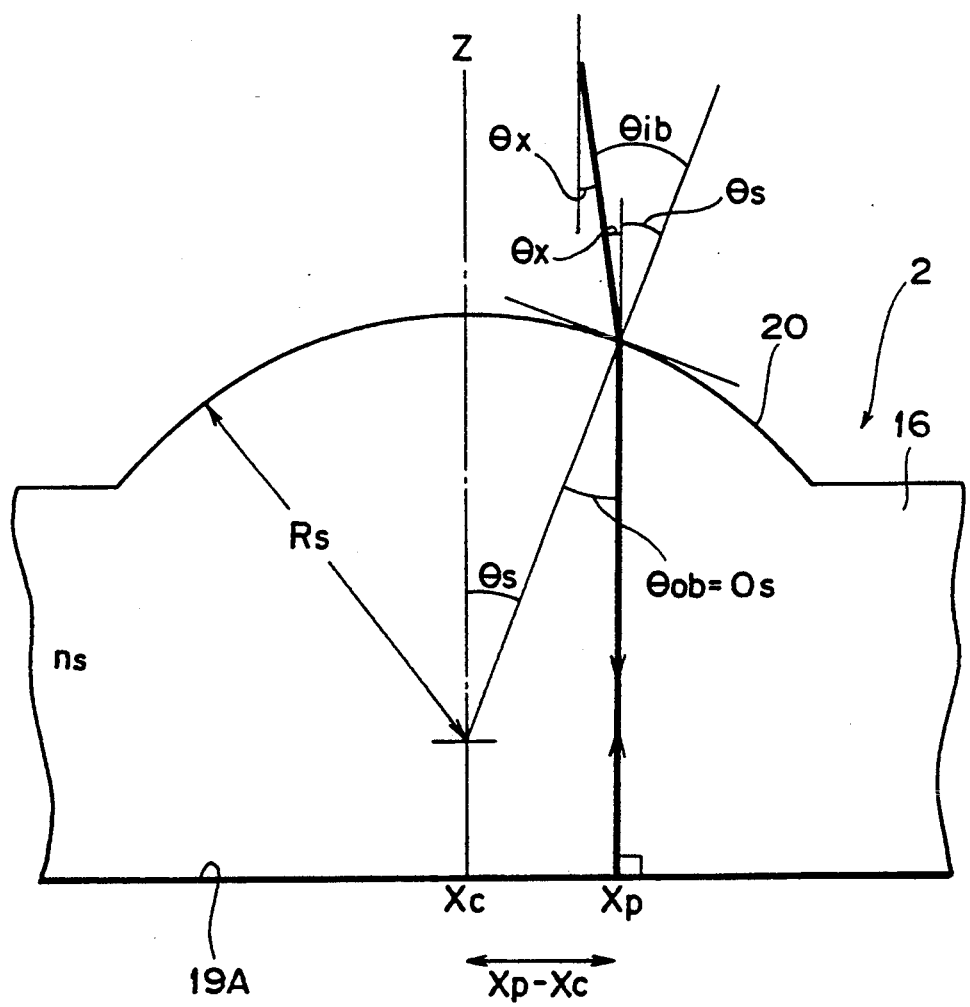
FIG. 6 is a view indicating how an expression (2) of the invention is introduced.

How the expression (2) above is introduced will now be explained with reference to FIG. 6. It is assumed that $\theta_x$ is the angle formed between the Z axis perpendicular to the electrode surface 19A and the axis of the light incident on the light-receiving element 2; that $\theta_{ib}$ and $\theta_{ob}$ are respectively the angles of inbound and outbound light beams to and from the surface of the lens 20; and that $\theta_s$ is the angle formed between the straight line passing through the incidence point and the center of the radius of curvature of the lens 20 on the one hand, and the Z axis on the other. Given the assumptions above, the conditions for a given light beam to reach perpendicularly to the electrode surface 19A are: $\theta_{ob} = \theta_s$ and $\theta_{ib} = \theta_x + \theta_s$. Under these conditions, the following expression (3) holds:

$$X_p - X_c = R_S \cdot \left[ \frac{\sin^2\theta_x}{(n_s - \cos\theta_x)^2 + \sin^2\theta_x} \right]^{\frac{1}{2}} \quad (3)$$

When the angle $\theta_x$ in the expression (3) is sufficiently small, the expression (3) may be solved for that angle. The result is used for the expression (2) given above. When the tilt angle $\theta_x$ of the optical fiber is thus obtained, a required tilt angle of the same fiber may be established with reference to that obtained angle. In this example, the angle $\theta_y$ is zero because the X axis is established on the plane containing the geometric center axis of the optical fiber and a projection of the latter axis onto the electrode surface. Where the angle $\theta_y$ is not zero, both angles $\theta_x$ and $\theta_y$ may be calculated in the same manner as for the above-mentioned $\theta_x$ computation. In this example, the tilt angle of the optical fiber is readily calculated from three measurements, $X_1$, $X_2$ and $X_p$. Because the errors in measurements accumulated according to the invention are far less than with the prior art, the measuring accuracy is improved significantly. It should be noted that $X_1$ and $X_2$ are X coordinates that afford half of the maximum optical coupling efficiency on the tolerance curve. The tilt angle of the optical fiber whose end is treated perpendicular to the axial direction of the fiber is also measured in the same manner as with the THF.

(A-1-2) Where the optical fiber end is so treated as to emit light in the direction substantially perpendicular to the fiber axis direction (SEF)

Figure 7A:
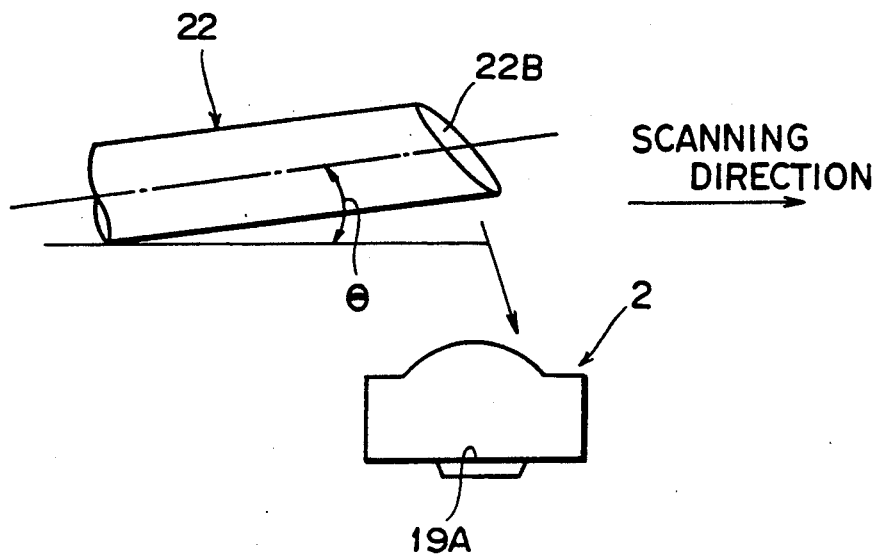
FIGS. 7A and 7B are views showing respectively how the tilt angle and the rotation angle of a slant end fiber are obtained according to the invention.
Figure 7B:
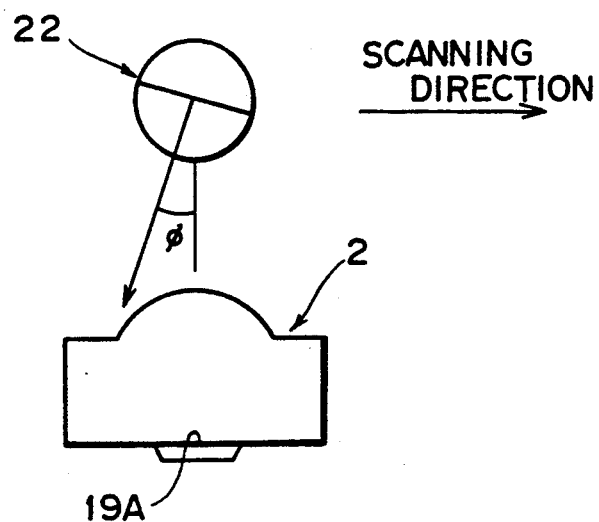

In one setup, as shown in FIG. 7A, the optical fiber 22 is scanned in the direction which exists on the plane comprising the geometric center axis of the fiber and a projection of that center axis onto the electrode surface 19A and which also exists on a plane paralleling the electrode surface 19A. This setup allows the tilt angle $\theta$ of the optical fiber 22 to be measured. Based on the measurement thus taken, the tilt angle of the optical fiber 22 may be adjusted as required. In another setup, as depicted in FIG. 7B, the optical fiber 22 is scanned in the direction which exists on a plane perpendicular to the geometric center axis of the fiber and in parallel with the electrode surface 19A. This setup allows the rotation angle $\phi$ of the optical fiber 22 to be measured. According to the measurement thus taken, the rotation angle of the optical fiber 22 may be adjusted as required.

Figure 8A:
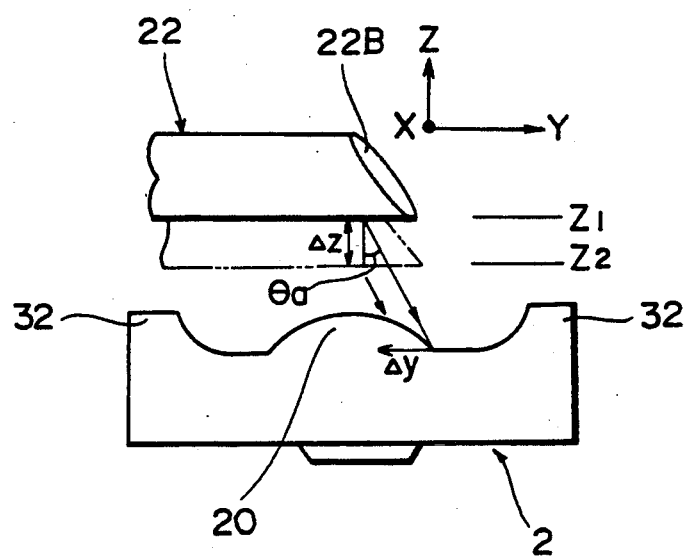
FIGS. 8A and 8B are views depicting how the distance between optical fiber and light-receiving element is adjusted according to the invention.
Figure 8B:
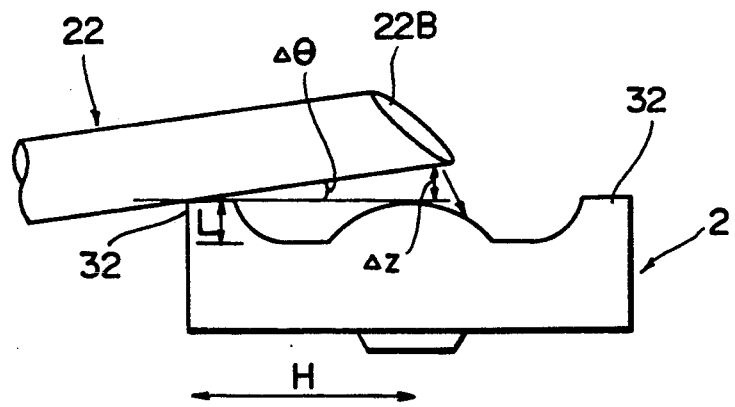

(A-2) Adjusting system for adjusting the distance between optical fiber and light-receiving element The adjusting process of the system according to the invention comprises three steps: a first step for obtaining the intensity distribution of the reflected feedback light in the axial direction of the fiber; a second step for determining the positional relationship between optical fiber and light-receiving element in accordance with the region where the measured intensity increases in the intensity distribution of the reflected feedback light; and a third step for acquiring a required positional relationship between optical fiber and light-receiving element on the basis of the relationship determined in the second step. The optical fiber used here is an SEF (slant end fiber) 22 having an end 22B treated to emit light in the direction substantially perpendicular to the axial direction of the fiber, as illustrated in FIGS. 8A and 8B. Also in FIGS. 8A and 8B, the light-receiving element 22 has a projection 32 that is higher in elevation than the lens 20. In the second step, the positional relationship between optical fiber 22 and light-receiving element 2 is determined through the contact between fiber 22 and projection 32. The process of ascertaining the contact comprises three more steps: a step for positioning the optical fiber 22 in the region where the measured intensity increases in the intensity distribution of the reflected feedback light; another step for moving the optical fiber 22 toward the light-receiving element 2 while monitoring the measured intensity; and another step for obtaining the reference position where the rate of changes in the measured intensity with respect to the distance between optical fiber 22 and light-receiving element 2 varies discontinuously. Below is a more detailed description of what takes place in these steps.

FIG. 8A shows a state in which the optical fiber 22 is yet to come in contact with the projection 32 of the light-receiving element 2, and FIG. 8B depicts a state where the optical fiber 22 has come into contact with the projection 32. Initially, in a given Z coordinate, the optical fiber 22 is moved on a plane in parallel with the X-Y plane so that the intensity of the reflected feedback light is maximized. Then with the X and Y coordinates fixed, the optical fiber 22 is moved closer to the light-receiving element 2. That is, the Z coordinate of the optical fiber 22 is diminished. This is equivalent to displacing the emitted light beam in the negative Y axis direction. The displacement lowers the intensity of the reflected feedback light.

Figure 9A:
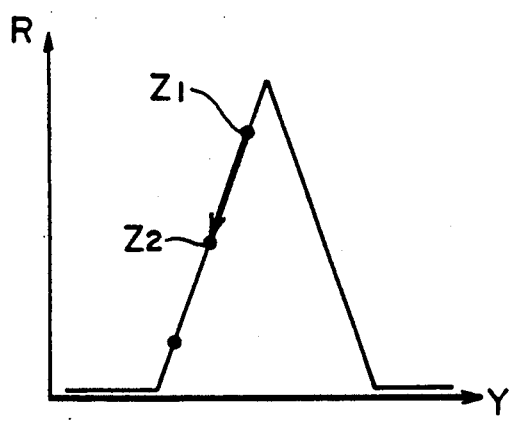
FIGS. 9A and 9B are graphic representations indicating respectively the relationship between reflected feedback light intensity R and Y coordinate, and the relationship between reflected feedback light intensity R and Z coordinate, both in connection with the invention.
Figure 9B:
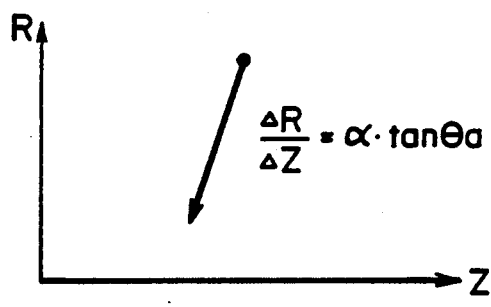

FIG. 9A is a graphic representation indicating how the intensity R of the reflected feedback light varies with respect to changes in the Y coordinate, and FIG. 9B depicts graphically how the reflected feedback light intensity R varies with respect to changes in the Z coordinate. Assume that $\Delta R$ represents the change in the intensity of the reflected feedback light, $\Delta Y$ the change in the Y coordinate, $\Delta Z$ the change in the Z coordinate, and $\alpha$ the ratio of $\Delta R$ to $\Delta Y$. Since there exists the relationship $\Delta Z = \Delta Y / \tan\theta_a$, one gets:

$$\Delta R/\Delta Z = \alpha \cdot \tan\theta_a \quad (4)$$

where, $\theta_a$ is the angle of the light emitted from the optical fiber 22.

Next to be considered is $\Delta R/\Delta Z$ in effect after the optical fiber 22 has come into contact with the projection 32 of the light-receiving element. With the optical fiber 22 in contact with the projection 32, the fiber 22 is lowered further. This causes the optical fiber 22 to bend at the edge of the projection 32 acting as a fulcrum. The bending of the optical fiber 22 is equivalent to increasing the angle of outbound light beam emission therefrom. As a result, the position of the outbound light beam emission is displaced in the negative Y axis direction, which in turn raises the intensity of the reflected feedback light. If H represents half of the diameter of the light-receiving element 2, the increase $\Delta\theta$ of the outbound light beam emission angle is given as $$\Delta\theta = -\Delta Z/H$$

The change $\Delta y$ in the Y coordinate is given as $$\Delta Y = \Delta\theta \cdot L/\cos\theta_a$$

Therefore, $$\Delta R/\Delta Z = -\alpha \cdot L/\cos\theta_a \quad (5)$$

The sign of $\Delta R/\Delta Z$ before the contact of the optical fiber 22 with the projection 32 is different from that in effect thereafter.

Figure 10:
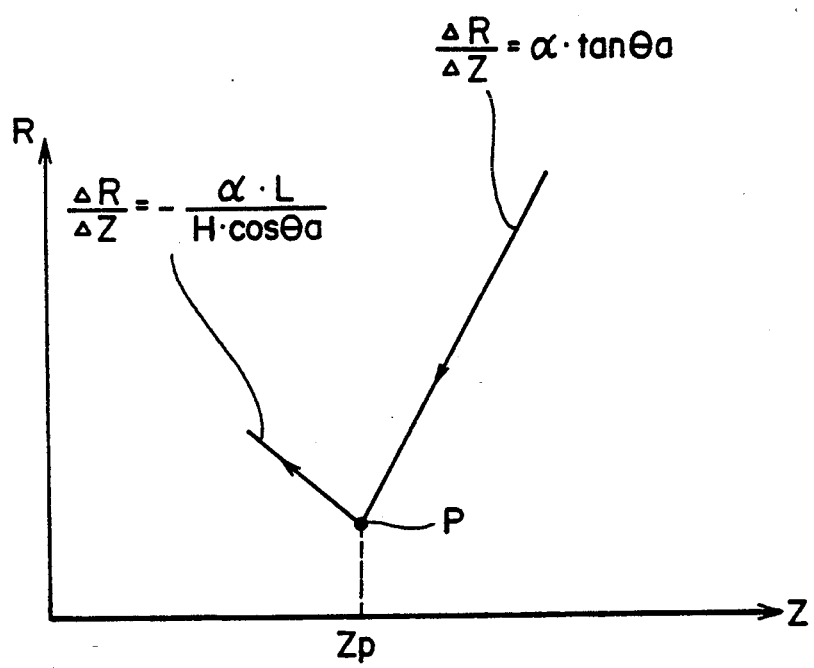
FIG. 10 is a graphic representation showing the relationship between reflected feedback light intensity R and Z coordinate before and after contact between the optical fiber and part of the light-receiving element in connection with the invention.

FIG. 10 graphically shows how the intensity R of the reflected feedback light varies with respect to changes in the Z coordinate before and after the contact between optical fiber 22 and projection 32. Plotting the changes in the reflected feedback light intensity R against the changes in the Z coordinate reveals a discontinuous point P, as shown in the graph of FIG. 10. The Z coordinate Zp of that discontinuous point represents the reference position in which the optical fiber 22 is in contact with the projection 32 of the light-receiving element. Thus positioning the optical fiber 22 at a required distance from the reference point provides a desired positional relationship between optical fiber and light-receiving element.

Conventionally, the reference position in which the optical fiber and the projection of the light-receiving element are in contact with each other is confirmed visually. In that case, the presence of the package on both sides of the light-receiving element makes it difficult to verify directly from either side the contact of the element with the optical fiber. The only way to make the confirmation is by looking down from above the light-receiving element to check if the optical fiber has indeed come into contact with the projection of the element. This method of knowing the reference position is often inaccurate. By contrast, the invention makes it possible to know exactly the reference position where the optical and the projection come in contact with each other. One benefit of this feature is that it prevents an optical fiber breakage resulting from too close an approach of the fiber to the light-receiving element.

As described and according to the invention, it is easy to know exactly the positional relationship between optical fiber and light-receiving element and to obtain a required positional relationship therebetween.

Figure 11A:
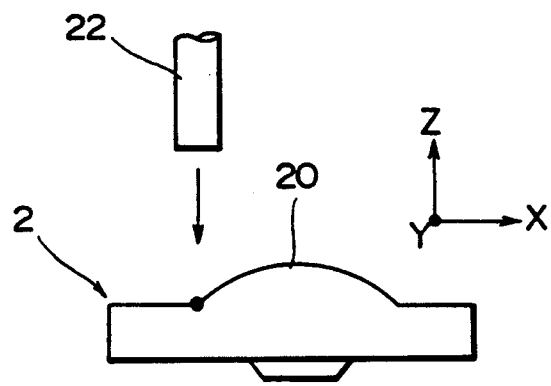
FIGS. 11A and 11B are views depicting how the positional relationship between optical fiber and light-receiving element is evaluated conventionally.

(B) Evaluating the positional relationship between optical fiber and light-receiving element Where the optical fiber coupled optically to the light-receiving element is to be fixed with bonding agent or by laser welding to a package or the like, it is necessary to evaluate precisely any misalignment between optical fiber and light-receiving element before and after the fixing as well as over time thereafter. Conventionally, the misalignment in the positional relationship between optical fiber and light-receiving element is evaluated using the setup of FIG. 11A. That is, the optical fiber 22 is placed opposite to the fringe of the lens 20 on the light-receiving element 2. As the optical fiber 22, is displaced within the X-Y plane, changes in the optical coupling efficiency are measured with respect to the fiber displacement. The measurements are used to evaluate the misalignment between optical fiber and light-receiving element.

Figure 11B:
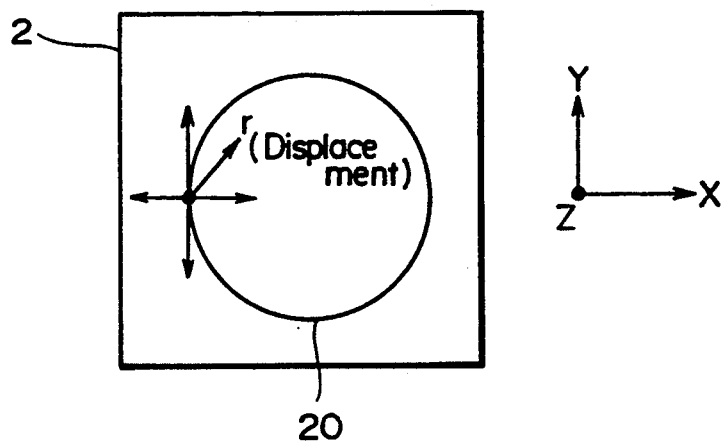
Figure 12A:
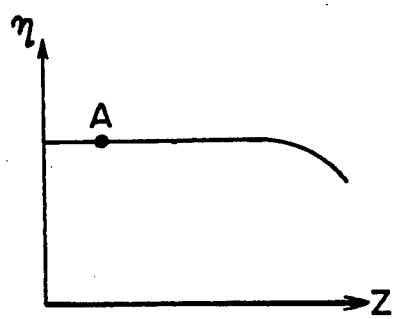
FIGS. 12A, 12B and 12C are views illustrating the principle of the conventional evaluating method depicted in FIG. 11.
Figure 12B:
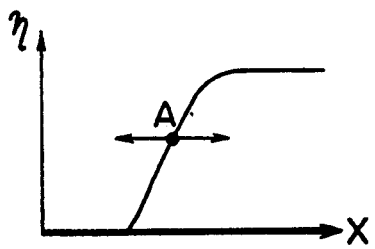
Figure 12C:
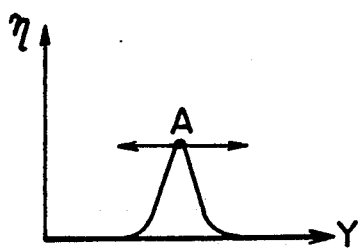

FIGS. 12A, 12B and 12C graphically show typical changes in the optical coupling efficiency of the optical fiber with respect to displacements in the Z, X and Y axis directions, respectively. The optical fiber is located at a point A that is a position opposite to the fringe of the lens on the light-receiving element. In this setup, the optical fiber is displaced in the r direction within the X-Y plane, as depicted in FIG. 11B, and the amount of that displacement is evaluated on the basis of the change in the optical coupling efficiency. This conventional method is effective in experimental terms but is not practically applied to commercial manufacture. The reason is that the optical fiber needs to be positioned opposite to that fringe of the lens which is not very high in optical coupling efficiency.

Figure 13A:
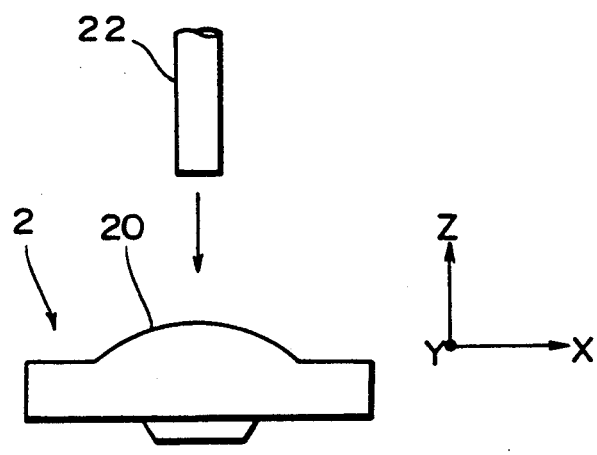
FIGS. 13A and 13B are views indicating how the positional relationship between optical fiber and light-receiving element is evaluated according to the invention.
Figure 13B:
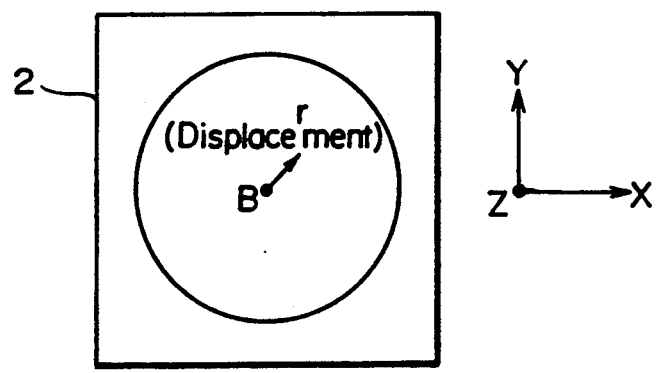
Figure 14A:
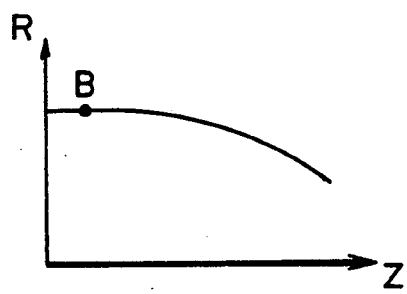
FIGS. 14A, 14B and 14C are views illustrating the principle of the evaluating method according to the invention.
Figure 14B:
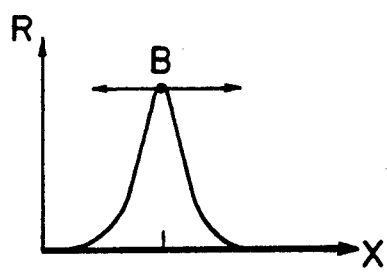
Figure 14C:
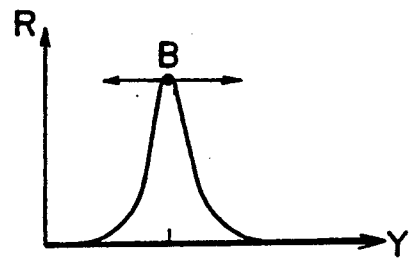

According to the invention, as shown in FIG. 13A, the optical fiber 22 is scanned on the X-Y plane while the axis of light beam emission from the fiber is kept substantially perpendicular to the electrode surface 19A of the light-receiving element. From this setup, the intensity distribution of the reflected feedback light in the fiber scanning direction is obtained. Then the optical fiber 22 is moved close to the position that affords the highest intensity in the intensity distribution of the reflected feedback light. FIGS. 14A, 14B and 14C graphically depict how the reflected feedback light varies with displacements of the optical fiber 22 in the Z, X and Y axis directions, respectively. The point B in the figures stands for the position that affords the highest intensity of the reflected feedback light. The intensity of the reflected feedback light is measured before and after a misalignment in the positional relationship between optical fiber 22 and light-receiving element 2, and the measurements are compared. The comparison permits evaluation of the misalignment of the optical fiber 22 on the X-Y plane. The Z coordinate is established in a region where the change in the intensity of the reflected feedback light is small with respect to the change of the Z coordinate. This makes it possible to evaluate accurately the displacement on the X-Y plane while any change of the measured intensity caused by the displacement in the Z axis direction is eliminated. In one preferred embodiment of the invention, the axis of light beam emission from the optical fiber is held substantially perpendicular to the electrode surface of the light-receiving element. The reason for adopting the above setup is that it secures a greater region where the change in the intensity of the reflected feedback light is small with respect to the change of the Z coordinate, than the conventional setup of establishing the axis of light beam emission from the optical fiber obliquely relative to the electrode surface of the light-receiving element.

Figure 15:
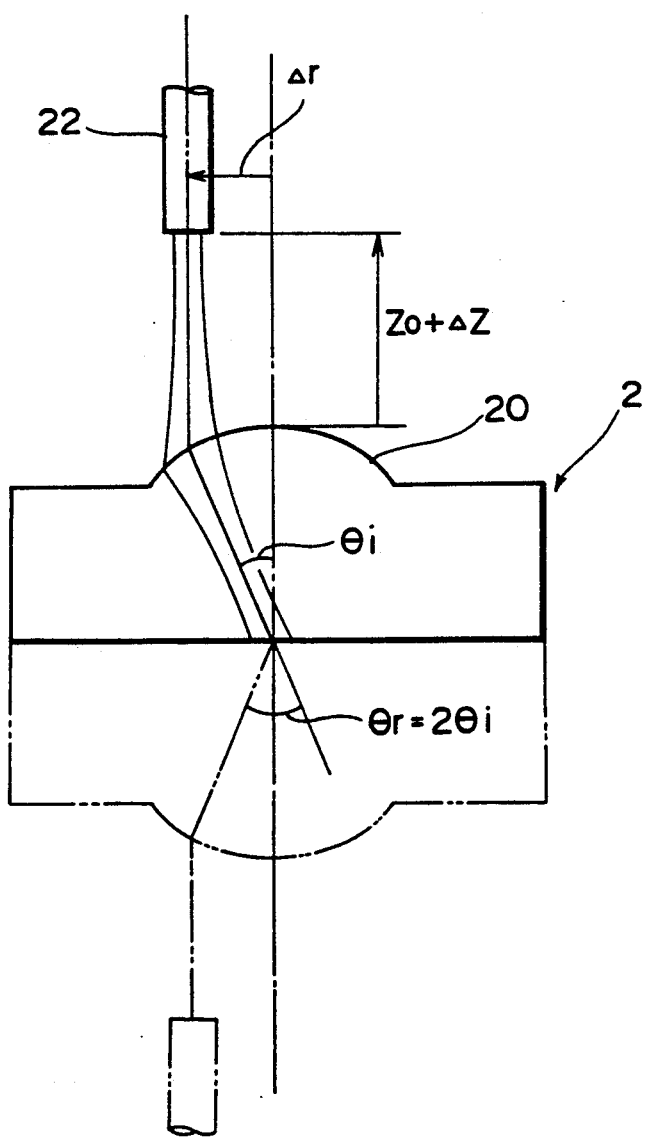
FIG. 15 is a view describing how the intensity distribution of the reflected feedback light is acquired according to the invention.

Considered next with reference to FIG. 15 is the intensity distribution of the reflected feedback light where the axis of light beam emission from the optical fiber 22 is perpendicular to the electrode surface of the light-receiving element 2. The intensity R of the reflected feedback light is given by the expression (6):

$$R = R_m \cdot exp(-2 \cdot \beta \cdot W) \cdot \eta_r \qquad (6)$$

where, $R_m$ is the reflectance of the electrode surface, $exp(-2 \cdot \beta \cdot W)$ is the absorption factor of the light-absorbing layer in the light-receiving element, and $\eta_r$ is the coupling efficiency of the reflected feedback light to the optical fiber. If the optical fiber develops a misalignment $\Delta r$, the angle of incidence $\Delta i$ on the electrode surface is increased and the coupling efficiency $\eta_r$ is lowered. That in turn reduces the intensity of the reflected feedback light. Thus the intensity distribution of the reflected feedback light is obtained by finding $\eta_r$ with respect to $\Delta r$. Finding the coupling efficiency $\eta_r$ of the reflected feedback light to the optical fiber is equivalent to acquiring the coupling efficiency relative to an optical fiber disposed virtually in mirror image across the electrode surface, as shown in FIG. 15. If the electrode surface is taken as an overlap surface, what is then needed is to find the coupling efficiency in effect when the angle between beams is $\theta_r (=2\theta_i)$. Thus one gets the expressions:

$$\eta_r = \frac{exp(-k^2 \cdot \theta_r^2 \cdot \omega_r^2/4/p)}{p} \qquad (7)$$

$$p = 1 + (k \cdot \omega_r^2/2/R_r)^2 \qquad (8)$$
$$k = 2 \cdot \pi \cdot n_s/\lambda$$

where, $\omega_r$ is the beam radius on the electrode surface, $n_s$ is the refractive index of the light-receiving element, $R_r$ is the radius of curvature of the beam on the electrode surface, and $\lambda$ is the wavelength of the light. In the case of paraxial approximation, the angle of incidence $\theta_i$ on the electrode surface is given by the expression:

$$\theta_i = \Delta r/f_s$$

$$f_s = n_s \cdot R_s/(n_s - 1) \qquad (9)$$

where $f_s$ is the focal distance of the lens, and $R_s$ is the radius of curvature of the lens. Then there exists the relationship:

$$\theta_r = 2 \cdot \theta_i \qquad (10)$$

between the incidence angle $\theta_i$ and the beam-to-beam angle $\theta_r$.

The beam radius $\omega_r$ on the electrode surface and the radius of curvature $R_r$ of the beam on the electrode surface are obtained using ray matrix elements A, B, C and D, as follows:

$$\omega_1 = (\omega_1^2 \cdot A^2 + a^2 \cdot B^2)^{\frac{1}{2}} \qquad (11)$$

$$R_r = \frac{\omega_1^2 \cdot A^2 + a^2 \cdot B^2}{\omega_1^2 \cdot A \cdot C + a^2 \cdot B \cdot D} \qquad (12)$$

where, a satisfies $a = \lambda/(\pi \cdot \omega_1) \cdot \omega_1$ stands for the beam radius (e.g., about 5 μm) on the optical fiber end. Now consider a case where the optical fiber end face is so treated as to be perpendicular to the axial direction of light beam emission therefrom. In this case, the ray matrix elements A, B, C and D are given by the following set of expressions on the assumption that the thickness of the light-receiving element equals the focal distance of the lens of the element:

$$A = 0$$

$$B = f_s/n_s$$

$$C = -1/f_s$$

$$D = -Z/f_s + 1/n_s \qquad (13)$$

It follows that the beam radius $\omega_r$ on the electrode surface and the radius of curvature $R_r$ of the beam on the electrode surface are given by the expressions:

$$\omega_r = \frac{\lambda \cdot f_s}{\pi \cdot \omega_1 \cdot n_s} \qquad (14)$$

$$R_r = \frac{f_s}{1 - Z \cdot n_s/f_s} \qquad (15)$$

It should be noted that $\omega_r$ is independent of the Z coordinate.

Referring now to the set of expressions (8), the value p is 1 because $R_r$ is infinite from the expression (15) when $Z=f_s/n_s$. Inserting the expressions (9), (10) and (14) in the expression (7) allows $\eta_r$ to be calculated as follows:

$$\eta_r = exp(-4 \cdot \Delta r^2/\omega_1^2) \quad (16)$$

Solving the expression (16) for $\Delta r$ results in:

$$\Delta r = \omega_1/2 \cdot (-ln(\eta_r))^{1/2} \quad (17)$$

The above expression provides the amount of misalignment.

The results above were obtained on the assumption that the Z position remains fixed at $Z_0$ ($=f_s/n_s$). Now consider a region in which $\eta_r$ is regarded as constant with respect to displacements in the Z position. From the expression (8), $\Delta p$ and $\Delta Z$ are defined as follows:

$$\Delta p = (k \cdot \omega_r^2/2/R_r)^2$$

$$Z = Z_0 + \Delta Z$$

At this point, the radius of curvature $R_r$ of the beam on the electrode surface is given by the expression:

$$R_r = -f_s^2/\Delta z/n_s$$

Therefore, $\Delta p$ is given as:

$$\Delta p = (k \cdot \omega_r^2/2/R_r)^2$$
$$= (\lambda \cdot \Delta Z/\pi/\omega_1^2))^2$$

From this, the condition of $\Delta Z$ for making $\Delta p$ sufficiently small is introduced as follows:

$$\Delta Z < \pi \cdot \omega_1^2/\lambda \quad (18)$$

When $\Delta Z$ satisfied the expression (18), the misalignment given by the expression (17) takes place. Where the wavelength of the light is 1.5 μm, the value of the right-hand side in the expression (18) is 51 μm. The above condition is met where it is desired to observe movements of several μm. When the drop in reflectance is 0.5, the amount of misalignment is 2.1 μm from the expression (17). In this manner, movements of several μm are readily detected.

Figure 16A:
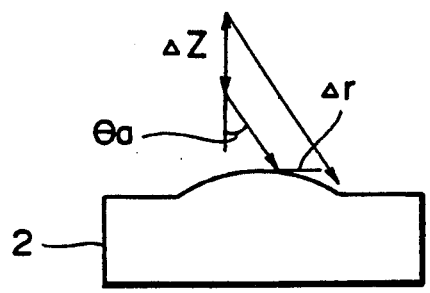
FIGS. 16A, 16B and 16C are views showing how the intensity distribution is obtained according to the invention where the emitted light axis of the optical fiber is tilted relative to the electrode surface.

Consider next a case where the axis of light beam emission from the optical fiber is oblique relative to the electrode surface. If $\theta_a$ stands for the angle of light beam emission from the optical fiber, as shown in FIG. 16A, the incidence angle $\theta_i$ satisfies the expression:

$$\theta_i = -r/f_s + \theta_a/n_s \quad (19)$$

If it is assumed that $$r = r_0 + \Delta r$$

($r_0 = f_s \cdot \theta_a/n_s$: reflectance peak position) then the incidence angle $\theta_i$ is given as $$\theta_i = -\Delta r/f_s$$

Figure 16B:
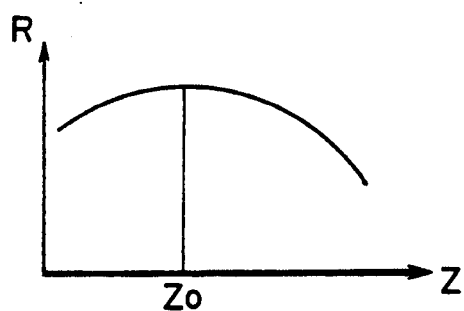
Figure 16C:
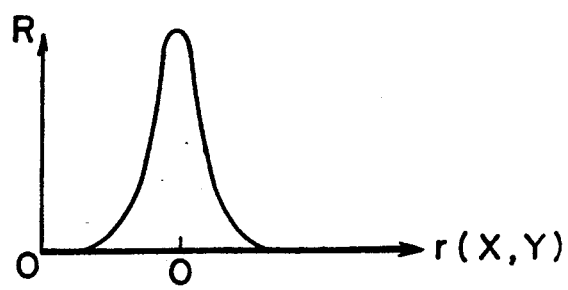

That is, as with the case where the axis of light beam emission from the optical fiber is perpendicular to the electrode surface, displacements from the peak position are detected. In the case of the oblique beam incidence, however, a large incidence angle $\theta_a$ lets movements of the Z position change the beam position, which adds to the displacement of $\Delta r$. This should preferably be compensated in a suitable manner. FIGS. 16B and 16C graphically plot changes in the reflected feedback light intensity R with respect to changes in the Z coordinate and in the value r (or X and Y coordinates), respectively. Where the manner of evaluating the positional relationship between optical fiber and light-receiving element was described above, the description involved quantitative considerations of the case in which the optical fiber end face is so treated as to be perpendicular to the axis of light beam emission therefrom. The same principle applies to the detection of misalignments in the X and Y directions with the THF and SEF, provided that the axis of light beam emission from the optical fiber is substantially perpendicular to the electrode surface of the light-receiving element.

FIG. 17 is a block diagram of typical equipment for operating the adjusting and evaluating systems according to the invention. The equipment is used to adjust or evaluate the positional relationship between optical fiber and light-receiving element illustratively where the light-receiving portion of the optical receiver is assembled. Referring to FIG. 17, the light-receiving element 2 is mounted on the substrate 6. The optical fiber 22 to be coupled optically to the light-receiving element 2 is supported by a pulse stage 36 in a way that permits adjustment of the positional relationship between the fiber 22 and the element 2. Fed with control signals from a pulse stage controller 48, the pulse stage 36 changes any one of the five parameters: X, Y and Z coordinates, tilt angle $\theta$, and rotation angle $\phi$ of the optical fiber 22. The optical fiber 22 has a first end 22B treated obliquely so that the axis of the light beam emission from the end becomes substantially perpendicular to the fiber axis. The first end 22B is coupled optically to the light-receiving element 2. A second end 22C of the optical fiber 22 is connected to an optical coupler 38. The coupler 38 is also connected with a light source 40 and an optical power meter 42.

The light output by the light source 40 passes through the coupler 38 and optical fiber 22, in that order, and is emitted from the first end 22B of the fiber 22. The emitted light is focused by the lens 20 of the light-receiving element and absorbed by the light-receiving portion thereof. The light reflected by the electrode surface 19A of the light-receiving element is sent back to the first end 22B of the optical fiber. The reflected feedback light passes through the optical fiber 22 and the coupler 38, in that order, to reach the optical power meter 42. The optical power meter outputs an electric signal that reflects the intensity of the light received. Reference numeral 44 indicates a photo-electric current detection circuit connected to the light-receiving element via the substrate 6. The photo-electric current detection circuit 44 supplies the light-receiving element 2 with a bias while detecting a photo-electric current Iph generated in the element 2. A processor 46 is fed with two kinds of electric signals: one from the optical power meter 42 representing the intensity of the reflected feedback light, the other from the photo-electric current detection circuit 44 representing the photo-electric current detected. The processor 46 operates on predetermined programs as well as on the signals input from the optical power meter 42 and photo-electric current detection circuit 44. In doing so, the processor 46 sends driving data to the pulse stage controller 48 so as to run one of the systems practiced according to the invention. Given the driving data, the pulse stage controller 48 sends control signals to the pulse stage 36 accordingly. The above series of operations makes it possible to adjust the rotation angle φ or tilt angle θ of the optical fiber 22, or the X, Y and Z coordinates for the first end 22B of the fiber 22. The above-described equipment may also be used to evaluate the positional relationship between optical fiber and light-receiving element when the program contents of the processor 46 are suitably changed.

Figure 18:
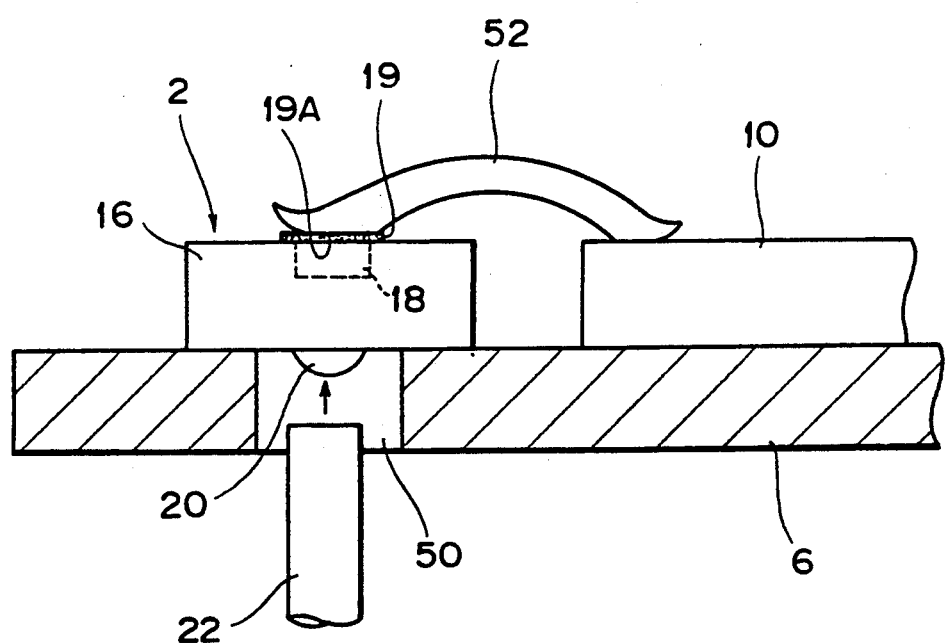
FIG. 18 is a view depicting an alternative way of coupling the back incidence type light-receiving element to the optical fiber according to the invention.

FIG. 18 is a view depicting an alternative way of coupling the back incidence type light-receiving element to the optical fiber according to the invention. In this example, a hole 50 is made on the substrate 6. The light-receiving element 2 is fixed upside down to the substrate 6 so that the lens 20 is located inside the hole 50. The optical fiber 22 is positioned so that its tip comes opposite to the lens 20 within the hole 50. The light-receiving element 2 is connected to the circuit parts 10 using bonding wires 52. With the back incidence type light-receiving element that adopts the bonding wires 52 instead of flip-chip bonding, the reflected feedback light is returned from the electrode surface 19A in the same manner as explained earlier. That in turn makes it possible to adjust or evaluate the positional relationship between optical fiber and light-receiving element on the basis of the intensity distribution of the reflected feedback light.

Figure 19:
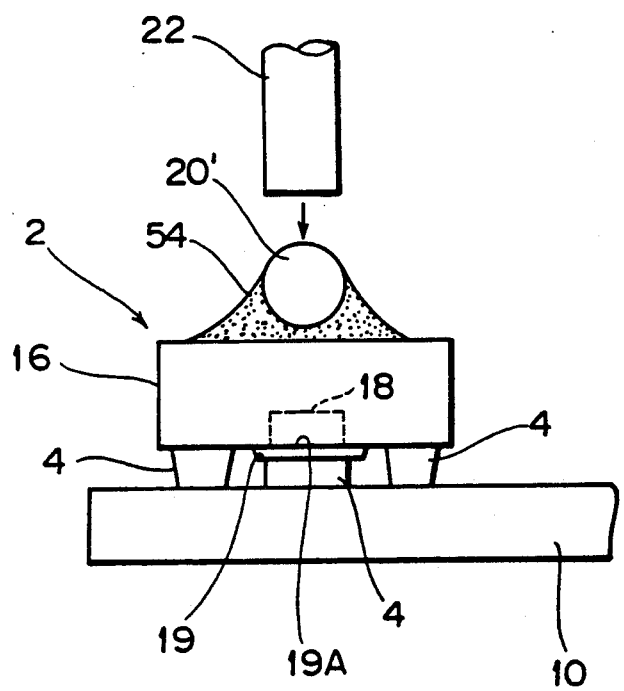
FIG. 19 is a view indicating another back incidence type light-receiving element according to the invention.

FIG. 19 is a view indicating another back incidence type light-receiving element according to the invention. Unlike the above-described examples wherein the lens is a hemispherical lens formed monolithically on the semiconductor substrate, the example of FIG. 19 utilizes a spherical lens 20' made illustratively of glass and located on the side opposite to the electrode surface 19A of the semiconductor substrate 16. The lens 20' is fixed to the electrode surface with optical bonding agent 54. The invention may also be applied to this back incidence type light-receiving element.

As many apparently different embodiments of this invention may be made without departing from the spirit and scope thereof, it is to be understood that the invention is not limited to the specific embodiments thereof except as defined in the appended claims.

What is claimed is:

1. An adjusting system for adjusting a positional relationship between an optical fiber and a back incidence type light-receiving element containing a lens and a light-receiving portion with an electrode surface, said optical fiber being optically coupled to the light-receiving element having said lens located on the side opposite to said electrode surface on said light-receiving portion, said adjusting system comprising:

first means for scanning said optical fiber with respect to said light-receiving element so that light emitted from an end of said optical fiber is reflected by said electrode surface, the reflected light entering again said optical fiber through said end, said first means further obtaining an intensity distribution of said reflected light in the direction of said scanning;

second means for obtaining the positional relationship between said light-receiving element and said optical fiber on a basis of a region where measured intensity in said intensity distribution increases; and third means for establishing a required positional relationship between said light-receiving element and said optical fiber by displacing at least one of said light-receiving element and said optical fiber in accordance with the positional relationship obtained by said second means.

2. An adjusting system according to claim 1, wherein said first means obtains said intensity distribution while scanning said optical fiber in a predetermined direction within a plane paralleling said electrode surface;

wherein a parameter defining the positional relationship obtained by said second means includes a first angle formed between a plane perpendicular to said predetermined direction on the one hand, and an axis of light emitted from the end of said optical fiber on the other; and wherein said third means adjusts a second angle selected from a tilt angle and a rotation angle of said optical fiber so that said first angle will take a required value.

3. An adjusting system according to claim 2, wherein said end of said optical fiber is treated so as to emit light in an axial direction of the fiber.

4. An adjusting system according to claim 3, wherein said end of said optical fiber has a flat face so treated as to be perpendicular to said axial direction.

5. An adjusting system according to claim 3, wherein said end of said optical fiber is treated in a tapered and hemispherically ending manner.

6. An adjusting system according to claim 3, wherein said predetermined direction is located on a plane containing said axial direction and a projection of said axial direction onto said electrode surface, said second angle being the tilt angle of said optical fiber.

7. An adjusting system according to claim 6, wherein said predetermined direction extends from negative to positive side of an X axis, said second means comprising:

means for measuring a coordinate $X_c$ providing a center point of a region where the intensity of the light emitted from said optical fiber and entering said light-receiving portion is greater than a predetermined value;

means for measuring a coordinate $X_p$ providing a maximum intensity of said intensity distribution; and means for calculating said first angle, represented by $\theta_x$, using an expression:

$$\theta_x = \frac{(X_p - X_c)(n_s - 1)}{(R_s^2 - (X_p - X_c)^2)^{\frac{1}{2}}}$$

where $n_s$ and $R_s$ represent the refractive index and the radius of curvature of said lens, respectively.

8. An adjusting system according to claim 7, wherein said predetermined value is half of the maximum intensity of the light emitted by said optical fiber and entering said light-receiving portion.

9. An adjusting system according to claim 2, wherein said end of said optical fiber is treated so as to emit light in a direction substantially perpendicular to an axial direction of the fiber.

10. An adjusting system according to claim 9, wherein said predetermined direction is located on a plane containing said axial direction and a projection of said axial direction onto said electrode surface, said second angle being the tilt angle of said optical fiber.

11. An adjusting system according to claim 9, wherein said predetermined direction is perpendicular to said axial direction, said second angle being the rotation angle of said optical fiber.

12. An adjusting system according to claim 1, wherein said end of said optical fiber is treated so as to emit light in a direction substantially perpendicular to an axial direction of said optical fiber, said light-receiving element having a projection formed around said lens so that said projection is higher in elevation than said lens, said second means comprising:
   means for positioning said optical fiber in a region where measured intensity in said intensity distribution increases;
   means for moving said optical fiber toward said light-receiving element while monitoring said measured intensity; and
   means for obtaining a reference position where a rate of changes in said measured intensity varies discontinuously with respect to changes in the distance between said optical fiber and said light-receiving element;
   said third means further moving said optical fiber so that the distance between said reference position and said optical fiber will take a required value.

13. An evaluating system for evaluating a positional relationship between an optical fiber and a back incidence type light-receiving element containing a lens and a light-receiving portion with an electrode surface, said optical fiber being optically coupled to the light-receiving element having said lens located on the side opposite to said electrode surface on said light-receiving portion, said evaluating system comprising:
   means for scanning said optical fiber with respect to said light-receiving element so that light emitted from an end of said optical fiber is reflected by said electrode surface, the reflected light entering again said optical fiber through said end, said means further obtaining an intensity distribution of said reflected light in the direction of said scanning;
   means for positioning said optical fiber close to the position where a maximum intensity in said intensity distribution is given; and
   means for comparing measured intensity of said reflected light entering again said optical fiber through said end, between two points in time: before a change over time in said positional relationship, and thereafter.

14. An evaluating system according to claim 13, wherein an axis of light emitted from said optical fiber is substantially perpendicular to said electrode surface.

15. An evaluating system according to claim 13, wherein the distance between said optical fiber and said light-receiving element is established in a region where changes in said measured intensity are minimum with respect to changes in said distance.

* * * * *